(12) United States Patent
Fiedler et al.

(10) Patent No.: US 6,353,338 B1
(45) Date of Patent: Mar. 5, 2002

(54) REDUCED-SWING DIFFERENTIAL OUTPUT BUFFER WITH IDLE FUNCTION

(75) Inventors: Alan S. Fiedler, Bloomington; Brett D. Hardy, Edina, both of MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/783,690

(22) Filed: Feb. 14, 2001

Related U.S. Application Data

(60) Provisional application No. 60/236,935, filed on Sep. 28, 2000.

(51) Int. Cl.[7] .......................................... H03K 19/0175
(52) U.S. Cl. ......................................... 326/83; 326/115
(58) Field of Search .............................. 326/56–58, 80, 326/81, 83, 86, 115, 126

(56) References Cited

U.S. PATENT DOCUMENTS

| | | | | |
|---|---|---|---|---|
| 5,986,479 A | * | 11/1999 | Mohan | 326/115 |
| 6,028,449 A | * | 2/2000 | Schmitt | 326/80 |
| 6,211,699 B1 | * | 4/2001 | Sudjian | 326/66 |
| 6,288,581 B1 | * | 9/2001 | Wong | 327/108 |
| 6,310,509 B1 | * | 10/2001 | Davenport et al. | 327/407 |

* cited by examiner

*Primary Examiner*—Michael Tokar
*Assistant Examiner*—Don Phu Le
(74) *Attorney, Agent, or Firm*—Westman, Champlin & Kelly

(57) ABSTRACT

A differential output buffer includes first and second complementary data inputs, an idle input, and a differential output stage having first and second output stage control inputs and first and second differential data outputs. First and second push-pull circuits charge one of the first and second output stage control inputs toward a logic high voltage and discharge the other of the first and second output stage control inputs toward a logic low voltage based on relative logic states of the first and second data inputs. A logic low voltage supply generator is coupled to the idle input and the logic low voltage supply terminal for setting the logic low voltage as a function of the idle input.

18 Claims, 3 Drawing Sheets

REDUCED-SWING DIFFERENTIAL OUTPUT BUFFER WITH IDLE FUNCTION

CROSS-REFERENCE TO RELATED APPLICATIONS

This application claims priority from U.S. Provisional Application No. 60/236,935, filed Sep. 28, 2000, and entitled "REDUCED-SWING DRIVER WITH IDLE FUNCTION."

Cross reference is also made to U.S. Application No. 09/782,806, entitled "LOW-POWER DATA SERIALIZER", U.S. application Ser. No. 09/783,231, entitled "DATA SERIALIZER WITH SLEW RATE CONTROL", and U.S. application Ser. No. 09/782,843, entitled, "RESISTIVELY-LOADED CURRENT-MODE OUTPUT BUFFER WITH SLEW RATE CONTROL," which were filed on even date herewith.

BACKGROUND OF THE INVENTION

The present invention relates to integrated circuits. More specifically, the present invention relates to a reduced-swing differential output buffer having an idle function.

High-speed data communication circuits frequently use differential output buffers for transmitting data over transmission media. In certain communication applications, there is a need to be able to reduce the differential output swing of the output buffer to zero while leaving the common-mode output level of the buffer unchanged.

One existing approach for reducing the differential output swing uses first and second differential output buffers, where the second differential output buffer drives the first differential output buffer. The differential output swing of the first differential buffer is reduced to zero by cutting the tail current supplied to the second differential buffer. This causes both outputs of the second differential buffer to go to a logic high voltage level. This approach is effective in reducing the differential output swing of the first differential buffer while leaving the common-mode level of the differential output buffer unchanged, but suffers from additional power consumption by the second differential buffer during normal operation.

A low-power differential output buffer is therefore desired which is capable of reducing the differential output swing of the buffer to zero while leaving the common-mode output level of the buffer unchanged.

SUMMARY OF THE INVENTION

One aspect of the present invention relates to a differential output buffer which includes first and second complementary data inputs, an idle input, and a differential output stage having first and second output stage control inputs and first and second differential data outputs. First and second push-pull circuits charge one of the first and second output stage control inputs toward a logic high voltage and discharge the other of the first and second output stage control inputs toward a logic low voltage based on relative logic states of the first and second data inputs. A logic low voltage supply generator is coupled to the idle input and the logic low voltage supply terminal for setting the logic low voltage as a function of the idle input.

Another aspect of the present invention relates to a differential output buffer which includes first and second complementary data inputs, an idle input, a current-mode differential output stage, first and second push-pull circuits and a voltage supply generator. The idle input has an active state and an inactive state. The differential output stage includes first and second differential data outputs and first and second output stage control inputs. The first push-pull circuit is biased in series between logic high and logic low voltage supply terminals and has first and second inputs coupled to the first and second data inputs, respectively, and an output coupled to the first output stage control input. The second push-pull circuit is biased in series between the logic high and logic low voltage supply terminals and has first and second inputs coupled to the second and first data inputs, respectively, and an output coupled to the second output stage control input. The voltage supply generator is coupled between the idle input and the logic low voltage supply terminal and generates a logic low voltage on the logic low voltage supply terminal when the idle input is in the inactive state and a logic high voltage on the logic low voltage supply terminal when the idle input is in the active state.

Another aspect of the present invention relates to a method of reducing a differential output swing of a differential output buffer. The method includes: providing a differential transistor pair between first and second differential data outputs and a tail current source, wherein the differential transistor pair comprises first and second output stage control inputs; receiving first and second complementary data inputs; receiving an idle input having an active state and an inactive state; driving the first and second output stage control inputs between a logic high voltage level and a logic low voltage level using P-channel type transistors, based on relative logic states of the first and second data inputs; and raising the logic low voltage level toward the logic high voltage level when the idle input is in the active state.

DETAILED DESCRIPTION OF ILLUSTRATIVE EMBODIMENTS

Figure 1:
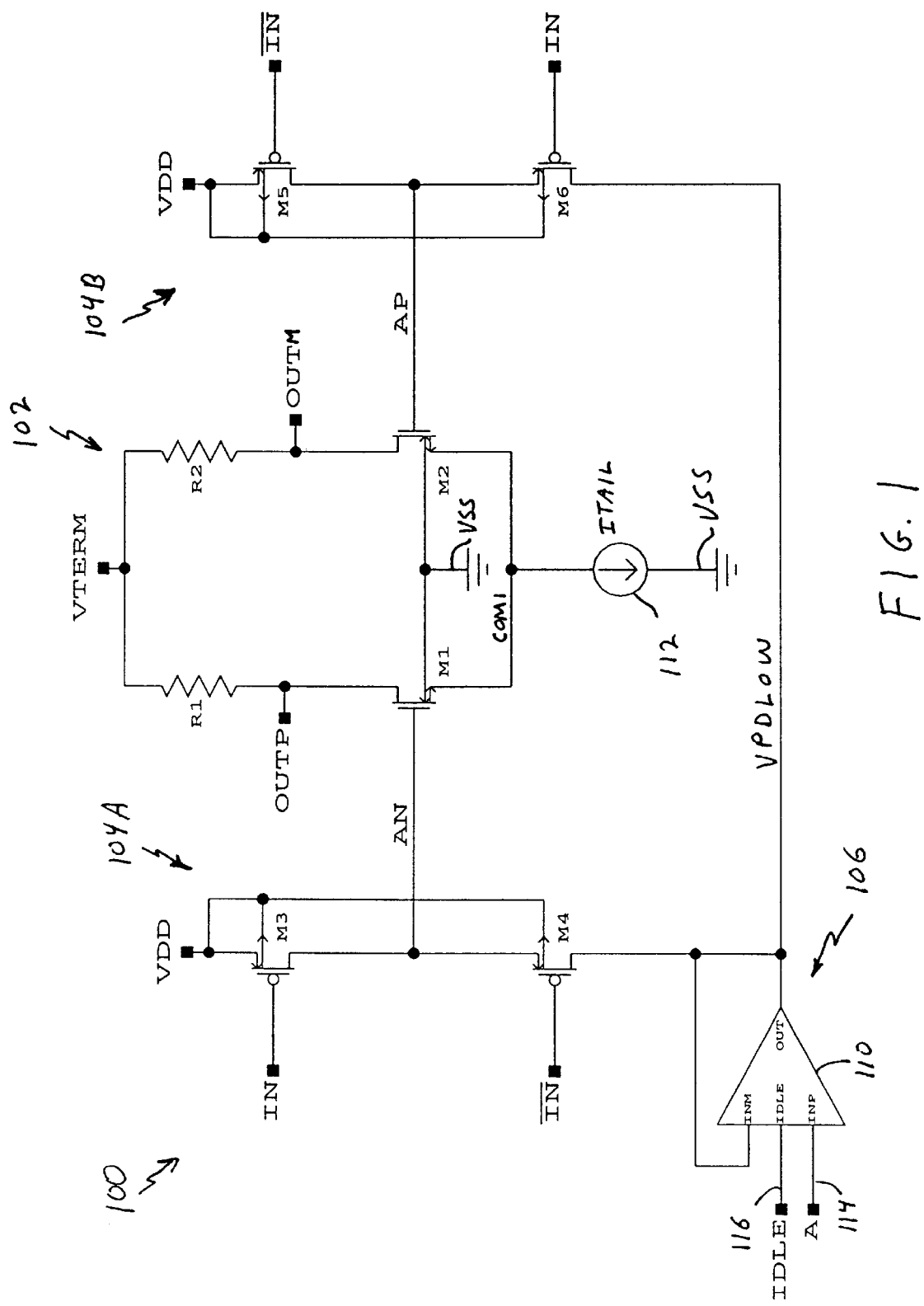
FIG. 1 is a schematic diagram of a current-mode logic type of differential output buffer according to one embodiment of the present invention.

FIG. 1 is a schematic diagram of a differential current-mode logic type of differential output buffer according to one embodiment of the present invention. Output buffer 100 includes output stage 102, push-pull circuits 104A and 104B and logic low voltage generator 106. Output stage 102 includes tail current source 112, a differential N-channel transistor pair M1 and M2, differential data outputs OUTP and OUTM and load resistors R1 and R2. Tail current source 112 generates a tail current ITAIL and is coupled between the sources of transistors M1 and M2, and common node COM1, and voltage supply terminal VSS (e.g., ground). The drain of transistor MN1 is coupled to data output OUTP, and the drain of transistor MN2 is coupled to data output OUTM. The substrates of transistors M1 and M2 are coupled to voltage supply terminal VSS. Differential data outputs OUTP and OUTM are coupled to termination voltage supply terminal VTERM through load resistors R1 and R2, respectively. Load resistors R1 and R2 may be on-chip, off-chip or both on-chip and off-chip. Resistors R1 and R2 represent the net effective load resistance connected to OUTP and OUTM, respectively.

Differential transistor pair M1 and M2 steer the tail current ITAIL through one side of output stage 102 or the other, depending on the relative voltages on the gates of each transistor in the pair. Thus, one of the differential outputs OUTP and OUTM will be pulled low by tail current source 112, and the other will be pulled high through the respective load resistor R1 or R2. The gates of transistors M1 and M2 are coupled to respective output stage control inputs AN and AP. Push-pull circuits 104A and 104B drive one of the output stage control inputs AN and AP high, and the other low, based on the relative logic states on data inputs IN and $\overline{IN}$.

Push-pull circuit 104A includes P-channel pull-up transistor M3 and P-channel pull-down transistor M4. Pull-up transistor M3 is coupled in series between voltage supply terminal VDD and output stage control input AN. Pull-up transistor M3 has a gate (i.e., a control terminal) which is coupled to data input IN and a substrate which is coupled to voltage supply terminal VDD. Pull-up transistor M3 drives output stage control input AN between two logic states, a logic high state and a high impedance state, depending on the logic state of data input IN.

Pull-down transistor M4 is coupled in series between output stage control input AN and logic low voltage supply terminal VPDLOW. Pull-down transistor M4 has a gate coupled to inverted data input $\overline{IN}$ and a substrate coupled to voltage supply terminal VDD. During normal operation, pull-down transistor M4 drives output stage control input AN between two logic states, a logic low state (set by the voltage on VPDLOW) and a high impedance state, depending on the logic state of inverted data input $\overline{IN}$.

Similarly, push-pull circuit 104B includes P-channel pull-up transistor M5 and P-channel pull-down transistor M6. Pull-up transistor M5 is coupled in series between voltage supply terminal VDD and output stage control input AP. Pull-up transistor M5 has a gate (i.e., a control terminal) which is coupled to inverted data input $\overline{IN}$ and a substrate which is coupled to voltage supply terminal VDD. Pull-up transistor M5 drives output stage control input AP between only two logic states, a logic high state and a high impedance state, depending on the logic state of inverted data input $\overline{IN}$.

Pull-down transistor M6 is coupled in series between output stage control input AP and logic low voltage supply terminal VPDLOW. Pull-down transistor M6 has a gate coupled to data input IN and a substrate coupled to voltage supply terminal VDD. During normal operation, pull-down transistor M6 drives output stage control input AP between only two logic states, the logic low state set by the voltage on VPDLOW and a high impedance state, depending on the logic state of data input IN.

The logic low voltage on VPDLOW is generated by logic low voltage generator 106. In the embodiment shown in FIG. 1, generator 106 includes an operational amplifier 110 which is coupled to voltage supply terminal VPDLOW as a voltage follower. Amplifier 110 has a non-inverting amplifier input INP coupled to a logic low reference voltage input 114, an inverting amplifier input INM coupled to voltage supply terminal VPDLOW, an amplifier output OUT coupled to logic voltage supply terminal VPDLOW, and an idle input IDLE coupled to idle input 116. Reference voltage input 114 receives an analog reference voltage, $V_A$. The voltage on amplifier output OUT follows the analog input voltage $V_A$, which is used to set the analog voltage level, $V_{VPDLOW}$, on voltage supply terminal VPDLOW during normal operation. Idle input 116 receives an idle control input signal IDLE, which controls whether buffer 100 is operated in a normal mode or an idle mode.

When IDLE is in an inactive state, amplifier 110 functions normally such that $V_{VPDLOW}=V_A$. When data input IN goes high and inverted data input $\overline{IN}$ goes low, pull-up transistor M3 turns off, pull-down transistor M4 turns on, pull-up transistor M5 turns on and pull-down transistor M6 turns off. Pull-down transistor M4 discharges the voltage on output stage control input AN toward the voltage on VPDLOW, and pull-up transistor M5 charges the voltage on output stage control input AP high toward the voltage on voltage supply terminal VDD. When data input IN goes low and inverted data input $\overline{IN}$ goes high, pull-up transistor M3 turns on, pull-down transistor M4 turns off, pull-up transistor M5 turns off and pull-down transistor M6 turns on. Pull-up transistor M3 charges the voltage on output stage control input AN high toward the voltage on voltage supply terminal VDD, and pull-down transistor M6 discharges the voltage on output stage control input AP low toward the voltage on logic low voltage supply terminal VPDLOW. The relative logic states on output stage control inputs AN and AP control the polarity of the differential output $V_{OUTP}-V_{OUTM}$. The differential outputs OUTP and OUTM have a common-mode voltage equal to $$\frac{V_{OUTP}+V_{OUTM}}{2}.$$

When idle input IDLE is asserted high to its active state, amplifier 110 slews the voltage on amplifier output OUT in a controlled manner from $V_A$ to the voltage on voltage supply terminal VDD. This causes the voltage swing on output stage control inputs AN and AP to reduce to zero and, by extension, the differential output swing on differential outputs OUTP and OUTM to reduce to zero. The output low voltages on output stage control inputs AN and AP are always equal to $V_{VPDLOW}$. As $V_{VPDLOW}$ slews from $V_A$ to VDD after idle input IDLE is asserted high, the peak-to-peak amplitude on differential outputs OUTP and OUTM diminishes to zero, but the common-mode voltage, $$\frac{V_{OUTP}+V_{OUTM}}{2},$$

of differential outputs OUTP and OUTM does not change. When idle input IDLE is re-asserted low to an inactive state, $V_{VPDLOW}$ will slew in a controlled manner from VDD to $V_A$.

Figure 2:
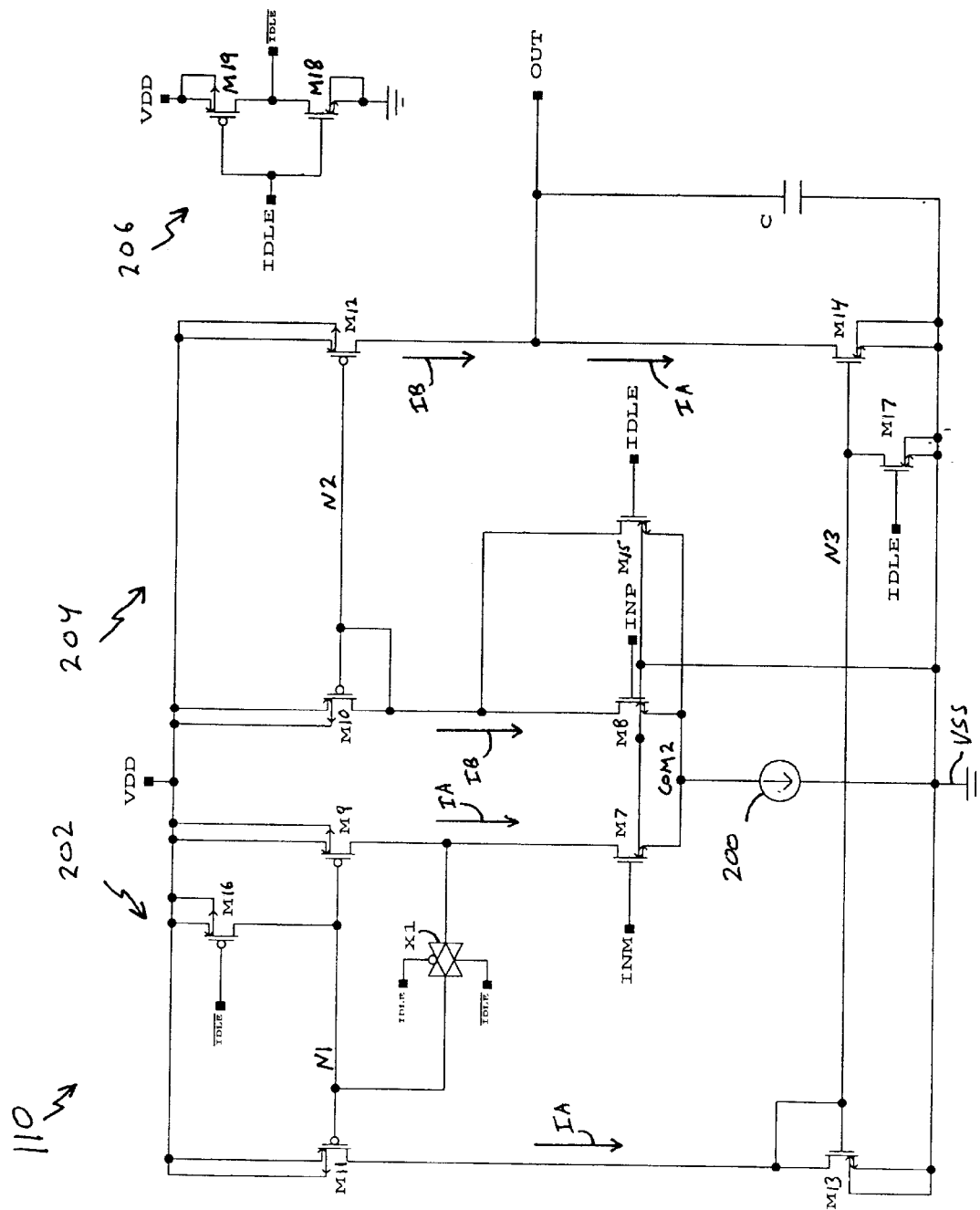
FIG. 2 is a schematic diagram of a single-stage differential to single-ended amplifier for generating a logic low voltage within the differential output buffer shown in FIG. 1, according to one embodiment of the present invention.

FIG. 2 is a schematic diagram of operational amplifier 110 according to one embodiment of the present invention. Operational amplifier 110 is a single-stage differential to single-ended amplifier. Amplifier 110 is simply one example of many amplifiers and other circuits that can be used for setting the voltage on VPDLOW as a function of the logic state on idle input 126.

Amplifier 110 includes a tail current source 200, a differential N-channel transistor pair M7 and M8, a first current mirror circuit 202 formed by P-channel transistors M9 and M11 and N-channel transistors M13 and M14, a second current mirror circuit 204 formed by P-channel transistors M10 and M12, and a capacitor C. Tail current source 200 is coupled between voltage supply terminal VSS and the sources of differential transistor pair M7 and M8, at common node COM2. The gates of transistors M7 and M8 are coupled to inverting amplifier input INM and non-inverting amplifier input INP, respectively. The drains of transistors M7 and M8 are coupled to the drains of transistors M9 and M10, respectively. Transistors M7 and M8 steer the tail current supplied by tail current source 200 through the right-hand side or left-hand side the transistor pair depending on the relative analog voltage levels on amplifier inputs INM and INP. The current steered through transistor M7 is labeled IA, and the current steered through transistor M8 is labeled IB.

Transistors M9 and M11 are coupled together to form a current mirror which mirrors the current IA at the drain of transistor of M9 into the drain of transistor M11. Transistor M9 has a source and substrate coupled to voltage supply terminal VDD and a gate coupled to the gate of transistor M11, at node N1. Transistor M11 has a source and substrate coupled to voltage supply terminal VDD and a drain coupled to the drain and gate of transistor M13.

Transistors M13 and M14 are coupled together to form a current mirror, which mirrors the current, IA, at the drain of transistor M13 into the drain of transistor M14. Transistor M13 has a source and substrate coupled to voltage supply terminal VSS and a gate and drain coupled to the gate of transistor M14, at node N3. Transistor M14 has a source and substrate coupled to voltage supply terminal VSS and a drain coupled to amplifier output OUT. Capacitor C is coupled between amplifier output OUT and voltage supply terminal VSS. Thus, the current mirror circuit 202 formed by transistors M9, M11, M13 and M14 mirrors the current IA in the left-hand side of differential transistor pair M7 and M8 into the drain of transistor M14, which serves to discharge capacitor C at amplifier output OUT.

Similarly, transistors M10 and M12 are coupled together to form a current mirror within current mirror circuit 204, which mirrors the current IB at the drain transistor M10 into the drain of transistor M12. Transistor M10 has a gate and drain coupled to the gate of transistor M12, at node N2, and a source and substrate coupled to voltage supply terminal VDD. Transistor M12 has a source and substrate coupled to voltage supply terminal VDD and a drain coupled to amplifier output OUT. Current mirror circuit 204 therefore mirrors the current IB in the right-hand side of the differential transistor pair M7 and M8 into the drain of transistor M12, which serves to charge capacitor C at amplifier output OUT. During normal operation, when idle input IDLE is in the inactive state, amplifier 110 charges and discharges the voltage on amplifier output OUT across capacitor C with currents IA and IB as a function of the relative analog voltage levels on inputs 120 and 122.

In order to implement the idle function, amplifier 110 further includes an N-channel idle control transistor M15, a P-channel current mirror disabling transistor M16, an N-channel current mirror disabling transistor M17, a transmission gate X1 and an inverter 206. Inverter 206 includes N-channel pull-down transistor M18 and P-channel pull-up transistor M19, which are coupled together to form an inverter for generating an inverted idle input $\overline{\text{IDLE}}$ based on non-inverted idle input IDLE. Idle control transistor M15 is coupled in parallel with transistor M8 between the drain of transistor M10 and common node COM2 and has a gate coupled to idle input IDLE. Current mirror disabling transistor M16 is coupled between node N1 and voltage supply terminal VDD and has a gate coupled to inverted idle input $\overline{\text{IDLE}}$. Current mirror disabling transistor M17 is coupled between the node N3 and voltage supply terminal VSS and has a gate coupled to idle input IDLE. Transmission gate X1 is coupled between the drain of transistor M7 and the gates of transistors M9 and M11, at node N1. Transmission gate X1 has a non-inverting input coupled to inverted idle input $\overline{\text{IDLE}}$ and an inverting input coupled to idle input IDLE.

When idle input IDLE is low, transistors M15, M16 and M17 are off, transmission gate X1 is closed and operational amplifier 110 functions normally. When idle input IDLE is asserted high, transistors M15, M16 and M17 turn on and transmission gate X1 becomes an open circuit. Transistor M15 bypasses transistor M8 to short the drain of transistor M10 to common node COM2. Transistors M16 and M17 and transmission gate X1 hold transistors M9, M11, M13 and M14 off. In this state, all of the tail current supplied by tail current source 200 is directed to the diode-connected P-channel transistor M1, and this current is mirrored into the drain of transistor M12 and onto capacitor C. The voltage on amplifier output OUT then charges until $V_{OUT}$ equals VDD. When idle input IDLE is re-asserted low, operational amplifier 110 functions normally, and the negative feedback from amplifier output OUT to inverting amplifier input INM causes all of the tail current supplied by tail current source 200 to be mirrored to the drain of transistor M14, discharging the voltage on amplifier output OUT until $V_{OUT}$ equal $V_{INP}$.

Figure 3:
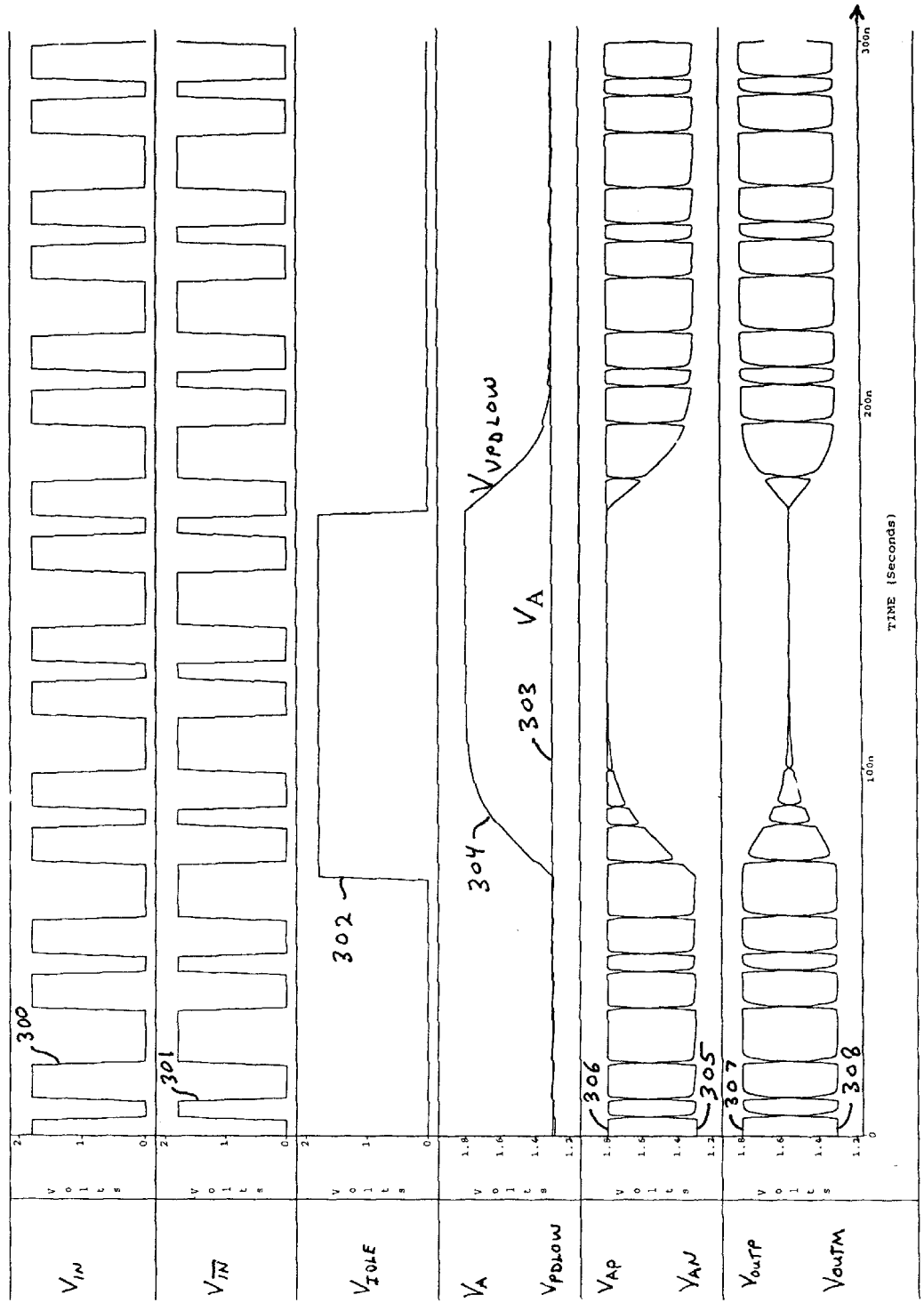
FIG. 3 is a timing diagram showing a simulation of various signals in the differential output buffer shown in FIG. 1 during execution of an idle function.

FIG. 3 is a timing diagram which illustrates various waveforms in the differential output buffer shown in FIG. 1. Waveforms 300 and 301 represent complementary input data signals applied to inputs IN and $\overline{\text{IN}}$, respectively. Waveform 302 represents the voltage on idle input IDLE. Waveform 303 represents the voltage $V_A$ applied to reference input A. Waveform 304 represents the logic low voltage $V_{VPDLOW}$ on logic low voltage supply terminal VPDLOW. Waveforms 305 and 306 represent the voltages $V_{AN}$ and $V_{AP}$ on output stage control inputs AN and AP, respectively. Waveforms 307 and 308 represent the voltages $V_{OUT}$ and $V_{OUTM}$ on differential outputs OUTP and OUTM, respectively.

When idle input IDLE is asserted high, as shown by waveform 302, the voltage $V_{VPDLOW}$ slews in a controlled fashion to VDD, as shown by waveform 304. The logic low voltages $V_{AN}$ and $V_{AP}$ on output stage control inputs AN and AP track $V_{VPDLOW}$ exactly, and the peak-to-peak voltage swing on differential outputs OUTP and OUTM drops to zero while the common-mode voltage $$\frac{V_{OUTP} + V_{OUTM}}{2}$$

remains steady and unchanged. The reverse occurs when idle input IDLE is de-asserted low. $V_{VPDLOW}$ slews in a controlled fashion from VDD to $V_A$, and the peak-to-peak output swing on outputs OUTP and OUTM is restored while the common-mode voltage $$\frac{V_{OUTP} + V_{OUTN}}{2}$$

again remains steady and unchanged.

The differential output buffer of the present invention is therefore capable of reducing the differential output swing to zero while leaving the common-mode level of the differential output unchanged. Instead of using a second differential output buffer to drive the inputs of a first differential output buffer as in the prior art, this second differential output buffer is replaced with P-channel switches (M3–M6) and a logic low voltage supply generator which drives the internal logic low voltage supply terminal VPDLOW. The differential output buffer of the present invention consumes virtually no static power and less total power than a circuit using a second differential output buffer.

This output buffer can be used in a variety of applications, including high-speed serial data communication circuits. In a serial data transceiver, a plurality of these differential output buffers are coupled in parallel with one another to the differential outputs OUTP and OUTM to form a time-division data multiplexer, which sequentially multiplexes the output of each buffer to differential outputs OUTP and OUTM. The sequential selection of data inputs is controlled by a clock circuit which has two or more phases. The clock phases are used to select individual data inputs and respective output buffers in a particular order. An example of such a time division multiplexer is discussed in U.S. application Ser. No. 09/782,806 which is entitled "LOW-POWER DATA SERIALIZER" and filed on even data herewith.

Although the present invention has been described with reference to preferred embodiments, workers skilled in the art will recognize that changes may be made in form and detail without departing from the spirit and scope of the invention. For example, the output buffer has been described with the use of complementary metal-oxide semiconductor (CMOS) field-effect transistors. However, transistors of other technologies can also be used. The terms "high" and "low" are arbitrary terms that are interchangeable in the specification and claims, and any element can be active high or low, with appropriate inversions. In addition, the term "coupled" used in the specification and the claims can include various types of connections or couplings and can include a direct connection or a connection through one or more intermediate components.

What is claimed is:

1. A differential output buffer comprising:
   logic high and logic low voltage supply terminals;
   first and second complementary data inputs;
   an idle input having an active state and an inactive state;
   a current-mode differential output stage comprising first and second differential data outputs and first and second output stage control inputs;
   a first push-pull circuit biased in series between the logic high and logic low voltage supply terminals and having first and second inputs coupled to the first and second data inputs, respectively, and an output coupled to the first output stage control input;
   a second push-pull circuit biased in series between the logic high and logic low voltage supply terminals and having first and second inputs coupled to the second and first data inputs, respectively, and an output coupled to the second output stage control input; and
   a voltage supply generator coupled to the idle input and the logic low voltage supply terminal, which generates a logic low voltage on the logic low voltage supply terminal when the idle input is in the inactive state and a logic high voltage on the logic low voltage supply terminal when the idle input is in the active state.

2. The differential output buffer of claim 1 wherein the first and second push-pull circuits are coupled to the first and second output stage control inputs through output drive transistors and wherein all the output drive transistors are P-channel type transistors.

3. The differential output buffer of claim 2 wherein the output drive transistors in each of the first and second push-pull circuits comprise:
   a pull-up transistor coupled in series between the logic high voltage supply terminal and the respective first or second output stage control input and having a pull-up control terminal coupled to one of the first and second data inputs; and
   a pull-down transistor coupled in series between the respective first or second output stage control input and the logic low voltage supply terminal and having a pull-down control terminal coupled to the other of the first and second data inputs.

4. The differential output buffer of claim 1 wherein the voltage supply generator comprises a single-stage differential to single-ended amplifier.

5. The differential output buffer of claim 4 and further comprising a logic low reference voltage input, wherein the amplifier comprises a non-inverting amplifier input coupled to the logic low reference voltage input, an inverting amplifier input coupled to the logic low voltage supply terminal, an amplifier output coupled to the logic low voltage supply terminal and an idle control input coupled to the idle input of the differential output buffer.

6. The differential output buffer of claim 5 wherein the amplifier further comprises:
   a ground voltage supply terminal;
   a tail current source coupled to the ground supply terminal;
   first and second transistors coupled as a differential transistor pair between the logic high voltage supply terminal and the tail current source and comprising first and second control inputs which form the inverting and non-inverting amplifier inputs, respectively, and first and second current paths through the first and second transistors, respectively;
   a voltage pull-down transistor coupled between the first current path and the amplifier output through a first current mirror circuit;
   a voltage pull-up transistor coupled between the second current path and the amplifier output through a second current mirror circuit;
   a third transistor coupled in parallel with the second transistor within the second current path and having a control terminal which forms the idle control input; and
   at least one disabling transistor which is coupled to the first current mirror circuit and has a control terminal coupled to the idle control input such that the disabling transistor enables the first current mirror circuit when the idle input of the differential output buffer is in the inactive state and enables the first current mirror circuit when the idle input of the differential output buffer is in the active state.

7. The differential output buffer of claim 6 wherein the amplifier further comprises a capacitor coupled between the amplifier output and the ground voltage supply terminal.

8. The differential output buffer of claim 1 wherein the differential output stage comprises:
   a ground terminal;
   a tail current source coupled to the ground terminal; and
   an n-channel differential transistor pair coupled to the first and second differential data outputs and comprising a common node coupled to the tail current source and a pair of transistor control terminals that forms the first and second output stage control inputs.

9. A differential output buffer comprising:
   logic high voltage supply terminal for supplying a logic high voltage;
   a logic low voltage supply terminal for supplying a logic low voltage;
   first and second complementary data inputs;
   an idle input;
   a differential output stage comprising first and second differential data outputs and first and second output stage control inputs;

first and second push-pull means for charging a voltage on one of the first and second output stage control inputs toward the logic high voltage and discharging the other of the first and second output stage control inputs toward the logic low voltage based on relative logic states of the first and second data inputs; and logic low voltage supply means coupled between the idle input and the logic low voltage supply terminal for setting the logic low voltage as a function of the idle input.

10. The differential output buffer of claim 9 wherein the first and second push-pull means are coupled to the first and second output stage control inputs through output drive transistors and wherein all the output drive transistors are P-channel type transistors.

11. The differential output buffer of claim 10 wherein the output drive transistors in each of the first and second push-pull means comprise:

a pull-up transistor coupled in series between the logic high voltage supply terminal and the respective first or second output stage control input and having a pull-up control terminal coupled to one of the first and second data inputs; and a pull-down transistor coupled in series between the respective first or second output stage control input and the logic low voltage supply terminal and having a pull-down control terminal coupled to the other of the first and second data inputs.

12. The differential output buffer of claim 9 wherein:

the idle input has an active state and an inactive state; and the logic low voltage supply means comprises means for setting the logic low voltage to a first voltage level when the idle input is in the inactive state and for raising the logic low voltage from the first voltage level toward the logic high voltage when the idle input is in the active state.

13. The differential output buffer of claim 12 wherein the logic low voltage supply means comprises a single-stage differential to single-ended amplifier.

14. The differential output buffer of claim 13 and further comprising a logic low reference voltage input, wherein the amplifier comprises a non-inverting amplifier input coupled to the logic low reference voltage input, an inverting amplifier input coupled to the logic low voltage supply terminal, an amplifier output coupled to the logic low voltage supply terminal and an idle control input coupled to the idle input of the differential output buffer.

15. The differential output buffer of claim 14 wherein the amplifier further comprises a ground terminal and a capacitor coupled between the amplifier output and the ground terminal.

16. The differential output buffer of claim 9 wherein the differential output stage comprises:

a ground terminal;

a tail current source coupled to the ground terminal; and an n-channel differential transistor pair coupled to the first and second differential data outputs and comprising a common node coupled to the tail current source and a pair of transistor control terminals that forms the first and second output stage control inputs.

17. A method of reducing a differential output swing of a differential output buffer, the method comprising:

(a) providing a differential transistor pair between first and second differential data outputs and a tail current source, wherein the differential transistor pair comprises first and second output stage control inputs;

(b) receiving first and second complementary data inputs;

(c) receiving an idle input having an active state and an inactive state;

(d) driving the first and second output stage control inputs between a logic high voltage level and a logic low voltage level using P-channel type transistors, based on relative logic states of the first and second data inputs; and (e) raising the logic low voltage level toward the logic high voltage level when the idle input is in the active state.

18. The method of claim 17 wherein step (d) comprises:

(d)(1) selectively driving the first or second output stage control input toward the logic high voltage level with first and second p-channel pull-up transistors, respectively, which are coupled in series between a logic high voltage supply terminal and the respective first and second stage output control inputs; and (d)(2) selectively driving the first or second output stage control input toward the logic low voltage level with first and second p-channel pull-down transistors, respectively, which are coupled as source-followers in series between the respective first and second output stage control inputs and a logic low voltage supply terminal.

* * * * *